US 6,743,268 B2

(12) United States Patent
Cote et al.

(10) Patent No.: US 6,743,268 B2
(45) Date of Patent: Jun. 1, 2004

(54) CHEMICAL-MECHANICAL PLANARIZATION OF BARRIERS OR LINERS FOR COPPER METALLURGY

(75) Inventors: William J. Cote, Poughkeepsie, NY (US); Daniel C. Edelstein, New Rochelle, NY (US); Naftali E. Lustig, Croton On Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/051,135

(22) Filed: Jan. 18, 2002

(65) Prior Publication Data

US 2002/0066234 A1 Jun. 6, 2002

Related U.S. Application Data

(62) Division of application No. 09/307,123, filed on May 7, 1999, now Pat. No. 6,375,693.

(51) Int. Cl.[7] .............................. C09G 1/02; C09G 1/04; B24B 1/00
(52) U.S. Cl. ............................... 51/308; 51/309; 106/3; 216/105; 438/691; 438/692; 438/693; 438/633; 438/687; 438/645
(58) Field of Search ................... 51/307, 308, 309; 106/3; 438/692, 693, 691, 622, 631, 633, 734, 627, 687, 648, 656, 643, 645, 653, 669, 672, 685; 216/105, 89; 252/79.1

(56) References Cited

U.S. PATENT DOCUMENTS 3,948,703 A    4/1976    Kushibe et al.
4,305,779 A   12/1981    Steeves et al.

(List continued on next page.)

FOREIGN PATENT DOCUMENTS

EP    0 659 858 A2    12/1994
EP    0 751 566 A2     6/1996
EP    0 773 269 A2    11/1996
EP    0 777 266 A1    11/1996
EP    0 826 756 A1     8/1997
EP    0 826 757 A1     8/1997
EP    0 881 673 A2     5/1998

OTHER PUBLICATIONS

Selective Chemical–Mechanical Polishing Process for Removal of Copper IBM TDB V. 36 No. 02, Feb. 1993.
"Alkaline Formulations for Chemical Mechanical Polishing of Copper Utilizing Azoel Passivation," IBM TDB V. 37, No. 10, Oct. 1994.
"Chemical Mechanical Polishing of Copper with Ammomium Persulfate," TDB V. 37 No. 10, Oct. 1994.
"Diffusion Barrier Studies for CU," Hu, et al V–MIC Conf. Jun. 9, 1986.
"Tantalum as a diffusion barrier between copper and silicon: Failure mechanism and effect of nitrogen addtions," Holloway et al., J. Appl. Phys. 71(11) Jun. 1, 1992, pp5433–5444.
"Comparison of High Vacuum and Ultra–high–vacuum Tantalum Difusion Barrier Performance Against Copper Penetration," Clevenger et al J. Appl Phys 73 (1), Jan. 1, 1993, pp. 300–8.

(List continued on next page.)

Primary Examiner—Michael Marcheschi
(74) Attorney, Agent, or Firm—Anthony J. Canale

(57) ABSTRACT

A tantalum-based liner for copper metallurgy is selectively removed by chemical-mechanical planarization (CMP) in an acidic slurry of an oxidizer such as hydrogen peroxide, deionized water, a corrosion inhibitor such as BTA, and a surfactant such as Duponol SP, resulting in a high removal rate of the liner without appreciable removal of the exposed copper and with minimal dishing.

8 Claims, 1 Drawing Sheet

U.S. PATENT DOCUMENTS

| | | |
|---|---|---|
| 4,395,302 A | 7/1983 | Courduvelis et al. |
| 4,430,468 A | 2/1984 | Schumacher |
| 4,436,584 A | 3/1984 | Bernacki et al. |
| 4,632,727 A | 12/1986 | Nelson |
| 4,747,907 A | 5/1988 | Acocella et al. |
| 4,789,648 A | 12/1988 | Chow et al. |
| 4,944,836 A | 7/1990 | Beyer et al. |
| 4,992,135 A | 2/1991 | Doan |
| 5,225,034 A | 7/1993 | Yu et al. |
| 5,244,534 A | 9/1993 | Yu et al. |
| 5,281,485 A | 1/1994 | Colgan et al. |
| 5,340,370 A | 8/1994 | Cadien et al. |
| 5,354,490 A | 10/1994 | Yu et al. |
| 5,447,887 A | 9/1995 | Filipiak et al. |
| 5,486,129 A | 1/1996 | Sandhu et al. |
| 5,514,245 A | 5/1996 | Doan et al. |
| 5,516,346 A | 5/1996 | Cadien et al. |
| 5,527,423 A | 6/1996 | Neville et al. |
| 5,575,885 A | 11/1996 | Hirabayashi et al. |
| 5,612,254 A | 3/1997 | Mu et al. |
| 5,614,444 A | 3/1997 | Farkas et al. |
| 5,622,525 A | 4/1997 | Haisma et al. |
| 5,676,587 A | 10/1997 | Landres et al. |
| 5,698,087 A | 12/1997 | Bokisa et al. |
| 5,746,947 A | 5/1998 | Vanderpool et al. |
| 5,770,095 A | 6/1998 | Sasaki et al. |
| 5,827,781 A | 10/1998 | Skrovan et al. |
| 5,840,629 A | 11/1998 | Carpio |
| 5,876,490 A | 3/1999 | Ronay |
| 6,063,306 A  * | 5/2000 | Kaufman et al. .............. 216/89 |
| 6,083,840 A  * | 7/2000 | Mravic et al. ................. 216/89 |
| 6,217,416 B1 * | 4/2001 | Kaufman et al. .............. 451/41 |

OTHER PUBLICATIONS

"Initial Study on Copper CMP Slurry Chemistries," Carpio, et al, Thin Solid Films 266 (1995), pp. 238–244 (No month).

"Method of Eliminating Ta Hydride Formation During Cu Plating on Ta Films," IBM TDB V. 34 No. 7A, Dec. 1991.

"Chemical Mechanical Polishing of Copper with Oxide and Polymer Interlevel Dielectrics," Gutmann, et al, Thin Solid Films 270 (1995) pp 596–600 (No month).

"Chemical Mechanical Polishing of Copper in Acidic Media," Luo, et al, ISMIC, Feb. 22, 1996.

* cited by examiner

CHEMICAL-MECHANICAL PLANARIZATION OF BARRIERS OR LINERS FOR COPPER METALLURGY

This application is a divisional of application Ser. No. 09/307,123, filed May 7, 1999, now U.S. Pat. No. 6,375,693.

FIELD OF THE INVENTION

The present invention relates generally to integrated circuit metallization, and more particularly to a methods of forming metallization by planarizing copper wiring wherein a liner is used under a copper layer.

BACKGROUND OF THE INVENTION

In the field of integrated circuit manufacturing, it is well known that significant density advantages result from forming planar metallization patterns which interconnect one or more transistors, capacitors, resistors, and other semiconductor electronic components formed on a wafer. One of the significant trends in the industry is produce such planar metallization patterns using so-called "Chemical-Mechanical Planarization" or "Chem-Mech Polish" or just "CMP" techniques. In CMP, the front side of a semiconductor wafer is held against a rotating polish wheel, and a polishing slurry is introduced that facilitates the planarization and partial removal of a metal layer on the wafer through a combination of chemical reaction and physical abrasion. See for example U.S. Pat. No. 4,944,836, issued Jul. 31, 1990 to Beyer et al. and assigned to the assignee of the present invention, which teaches the CMP of metals or insulators to form coplanar insulator/metal films.

In addition to the general advantages afforded by CMP, particular density advantages result from forming an integrated metallurgy in pre-planarized passivation. That is, as shown in U.S. Pat. No. 4,789,648, issued Dec. 6, 1988 to Chow et al and assigned to the assignee of the present invention (hereinafter the "Chow patent"), which teaches the method of forming coplanar imbedded lines in insulators where the lines include integral vias to underlying conductive layers. Normally, the horizontal (line) and vertical (via) portions of the metallurgy are formed using two separately formed layers of metal; the Chow patent maximizes conductivity by eliminating the interlayer interface that normally exists between the horizontal and vertical portions of the metallurgy structure.

In the prior art, it is well known to utilize aluminum alloys or tungsten as the metallurgy for integrated circuits. However, the conductivity characteristics of these materials may not be sufficient as the density of semiconductor chips increases below 0.4 microns. These metallurgies are typically deposited on the wafer utilizing chemical vapor deposition, sputtering or other directional deposition techniques. As chip area is reduced the aspect ratio (that is, the ratio of height relative to width) of vias, or openings, formed through passivation increases making it difficult to deposit metal into high aspect ration vias. The result can be the formation of voids in to metals deposited resulting in increased resistance or even failure to form useful contacts. In addition, at smaller geometries metal lines become more susceptible to electromigration-induced faults. Thus, the semiconductor industry has recently emphasized the development in the copper metallurgies to replace aluminum-based metallurgy. Although copper has low resistivity and higher electromigration resistance than aluminum, it has no standard deposition technique. No fewer than six different types of depositions methods have been investigated including chemical vapor deposition, sputtering, evaporation, plasma CVD, electroless and electroplating. Each has its advantages and disadvantages. In addition, several problems are required to be solved before a manufacturable copper technology can be defined.

Copper, which is highly sensitive to corrosion does not form a self-passivating oxide as does aluminum, presents unique challenges, particularly in the area of CMP.

Initial methods of implementing copper in semiconductor devices and planarization by CMP emphasized only the etching and abrasion of copper as evidenced by slurries such as Various slurries for CMP of copper have been proposed in the prior art. These techniquesinclude the following: water, a solid abrasive, an oxidant from one of HNO3, H2SO4, and AgNO3 as taught in U.S. Pat. No. 5,354,490 to, Yu et al.; and water, a solid abrasive, an oxidant: HNO3 or NH4OH and KMnO4 with a H2O2 buffering agent as taught in the article "Initial study on copper CMP slurry chemistries," Ronald Carpio et al., *thin solid films*, Vol. 266, No. 2, 1 October 1995, pp. 238–244.

Various reagents have been proposed as additives to copper CMP slurries to (1) retard the polishing/etch rate of interlevel dielectrics such as butanol as taught be U.S. Pat. No. 5,614,444 to Farkas et al. or (2) to retard the polish/etch rate of copper such as adding benzotriazole (BTA) as taught in U.S. Pat. No. 5,770,095 to Sasaki et al. or the article "Alkaline Formulations for Chemical Mechanical Polishing of Copper Utilizing Azole Passivation," anonymous, *IBM Technical Disclosure Bulletin*, Vol. 37, No. 10, October 1994, p. 187.

Because copper has a high diffusion rate in some dielectrics, particularly silicon dioxide, some form of barrier layer between interlevel dielectrics and copper metallurgy is required. Various barrier materials have been proposed including refractory metals such as titanium (Ti), tantalum (Ta), tungsten (W), compounds such as titanium nitride and tantalum nitride, alloys such as TiW, doped metals such as titanium or tantalum doped with nitrogen (Ti(N) or Ta(N)) and bilayers such as Ti/W or Ta/TaN have been proposed by any of several references.

CMP methods proposed to be used to polish or planarize copper metallurgy including under lying barrier materials have in many instances comprised a single slurry and polishing step as taught in U.S. Pat. No. 5,447,887 to Filipiak et al. (single step tantalum, titanium or titanium-tungsten barrier layer, slurry unidentified); U.S. Pat. No. 5,575,885 to Hirabayashi et al. (alkaline slurry with titanium, titanium nitride, niobium, tungsten or a copper-tantalum alloy); U.S. Pat. No. 6,612,254 to Mu et al. (ammonium hydroxide, silica and water with a barrier layer of Titanium nitride) and the article "CHEMICAL-MECHANICAL POLISHING OF COPPER IN ACIDIC MEDIAL" by Q. Luo et al., 1996 CMP-MIC Conference, Feb. 22–23, 1996, pp. 145–151 (Acidic ferric nitrate,BTA, poly ethlyene glycol surfactant, alumina and water with a titanium-tungsten alloy barrier layer).

Recently the evolution of copper CMP has included two-step processes as taught by U.S. Pat. No. 5,676,587 to Landers et al. (copper polish using alumina-based slurry selective to the copper and a silica-based slurry selective to the barrier layer of Ta/TaN) or a three-step process as taught by U.S. Pat. No. 5,516,346 to Cadien et al. (separate slurries for each of copper, tungsten and titanium nitride).

Most recently a barrier layer comprising a first layer of hexagonal phase tantalum nitride and a second layer of alpha-phase tantalum has been proposed in European Patent Application EP 0751566 A2 to Cabral et al. published Jan. 2, 1997.

Finally, co-pending US Provisional application 60/105,470 filed Oct. 23, 1998 teaches a slurry for copper comprising water, alumina, an oxidizing agent (ferric nitrate), a copper passivating agent (BTA) and a surfactant (Duponol SP) which has proved to be highly selective to copper over the liner of Cabral et al. European application EP 0 751 566 A2, as well as other tantalum-based liners.

SUMMARY OF THE INVENTION

In general, the prior art set forth above deals with polishing of copper with and without barrier materials in conventional metal line or stud via applications. However, when polishing metal in a dual Damascene environment where both lines and studs may be formed, as shown in the Chow patent, particular challenges are presented that must be addressed in the CMP process. As shown in FIG. 1, oxide 10 has narrow openings 12 that define vias, and wide openings 14 that define the metal lines. Each opening is filled with liner 20 and copper 22. As initially deposited, copper layer 22 extends over portions of barrier layer 20 and is removed by a separate CMP step as described in co-pending Provisional Application Serial No. 60/105,470 filed Oct. 23, 1998, the teachings of which are incorporated herein by reference. The removal of the overlying copper results in the structure as shown in FIG. 2

In the invention, the portions of the metal layers 20 and 22 formed above the upper surface of oxide 10 are removed by CMP, utilizing the polishing slurry of the invention. During this operation, two goals are to be achieved. One is to maximize the removal rate of the copper, because the faster the polish process can be achieved the more wafers can be processed per unit time, decreasing the overall cost. Another goal is to remove the copper without appreciably removing the liner, because removal of the liner could lead to partial removal of the underlaying oxide, introducing non-planarity in the final surface and allows the switching to another slurry more selective to the liner. These goals of the copper CMP process (high removal rate of copper, without appreciable removal of the underlaying liner) can often be incompatible; in the prior art, removal rate of the bulk metal is often sacrificed in order to prevent excessive liner removal.

In addition, the copper slurry should minimize dishing and errosion in the polished copper. Ideally, when the CMP process is completed, the upper surface of the copper would be coplanar with the surrounding oxide. This result can be achieved for the copper in the narrow openings 12. However, in the wide openings 14, the pressure of the polish pad on the wafer results in a bowing (or "dishing") profile, in which the thickness of the copper at the center of the wide opening is less than the thickness at either end. In general, this structure is to be avoided, because it reintroduces non-planarity in the final BEOL structure and reduces the thickness of lateral interconnects such as line structures 14. Errosion is the removal of the non-copper regions between narrow lines in high density wiring areas. That is, it is undesirable for the planarization slurry to be yoo agressive in removing the interlevel dielectric (ILD) between lines once the ILD has been exposed.

Therefore, another object of the present invention is to provide a CMP process that minimizes dishing and errosion. The specific goal is to prevent the difference between the thin and thick regions of the copper within opening 14 from being greater than the thickness of the liner 14 disposed on the upper surface of the oxide 10.

In the invention, a liner or barrier layer for copper metallurgy comprising a refractory and/or its alloys and compounds is removed by CMP in an acidic slurry of an oxidizer such as hydrogen peroxide, deionized water, a corrosion inhibitor such as BTA, and a surfactant such as Duponol SP, resulting in a high removal rate of the liner including any remaining copper without appreciable removal of the underlying insulator layer.

BRIEF DESCRIPTION OF THE DRAWING

The above and other aspects of the present invention will become more clear upon review of the detailed description of the invention as set forth below. In the description to follow, reference will be made to the accompanying drawing.

DETAILED DESCRIPTION OF THE BEST MODE FOR CARRYING OUT THE INVENTION

Figure 1:
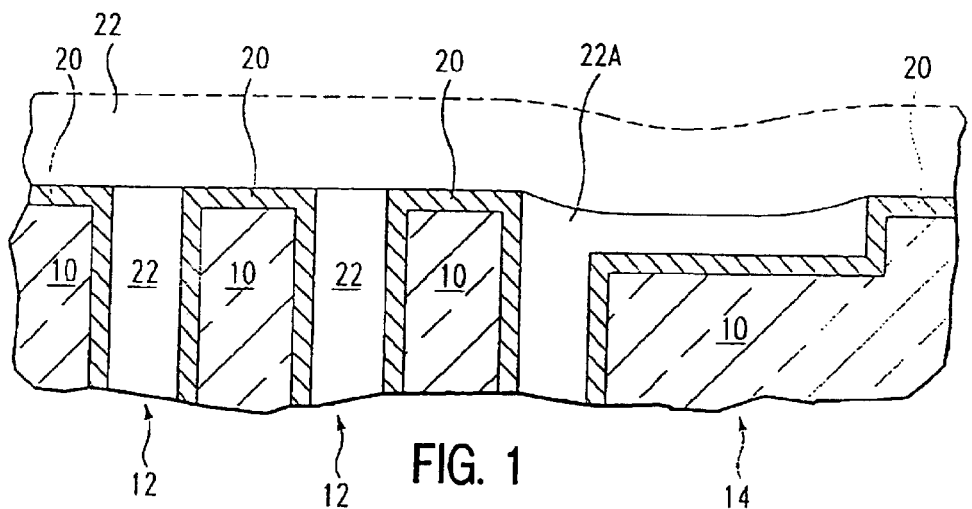
FIG. 1 is a cross sectional view of a substrate with a layers of copper and liner thereon in undergoing the CMP process of the invention.

In the invention as shown in FIG. 1, the liner 20 is on the order of 40–80 nm thick, and is comprised of tantalum. Specific materials include tantalum alloy and tantalum-based compositions: such as tantalum nitride, as well as other refractory metals and refractory metal alloys such as chromium and titanium/titanium nitride. A Ta-based barrier layer appears to provide the best combination of (a) promoting adhesion of copper to the oxide layer 10, and (b) preventing diffusion of copper, which is highly corrosive, into the underlaying silicon. In the practice of the invention, the specific layer to be polished is a tantalum-based layer comprising a bilayer of tantalum nitride and tantalum, each about 20–40 nm in thickness. Then the copper 22 is deposited onto the wafer, to a thickness (measured from the upper surface of oxide layer 10 to the upper surface of the copper layer) of approximately one micron. The copper layer can be formed using any deposition process that adequately fills the apertures oxide layer 10 without the formation of voids.

The upper portion of the copper layer is then planarized via CMP to remove those portions of the metal layers that overly the upper surface of the passivation layer, so as to form a co-planar metal/insulator surface. In practice, the workpiece of FIG. 1 is placed into the wafer holder of a CMP tool. Any one of a number of known CMP tools, including those available from IPEC Corp. and Strasbaugh Corp. could be used to carry out the present CMP operation. The CMP tool has a rotating polish wheel on which is mounted a polish pad. The CMP slurry of the invention is applied onto the polish pad, and the wafer holder brings the wafer into contact with the rotating polish wheel. In practice, the wafer holder spins in a direction opposite to that of the polish wheel. In the operation described below, typically the polish wheel rotates at a speed of approximately 75 revolutions per minute (RPM), and the wafer holder spins at a speed of approximately 50 RPM. Further, the wafer holder applies pressure to force the wafer against the polish pad. As will be described in more detail below, the inventors have found that non-woven pads provide the best tradeoff between high removal rates and low dishing and scratching. In the operation described below, the applied pressure is approximately 5 pounds per square inch (PSI). In practice, these three variables (spin speed of the wafer holder, rotation speed of the polish pad, pressure) are interrelated, and can and do vary as a function of e.g. the hardness and thickness of the layer to be polished.

In the slurry of the invention, solids such as silica particles having an average diameter at or below approximately 0.4 nm are used to provide physical abrasion of the liner material in the reaction while minimizing excessive scratching or other surface damage. The slurry includes the following components:

1) an oxidizer that promotes the removal of any residual copper remaining following the removal of the upper portion of the copper layer, an oxidizer including oxidizers from the following list can be used with varied success: ferric nitrate, hydrogen peroxide, potassium iodate, manganese oxide, ammonium hydroxide, ammonium persulphate, potassium persulphate, ammonium persulphate/sulfuric acid, potassium persulphate/sulfuric acid, ferric chloride/hydrochloric acid, chromic acid, chromic acid/hydrochloric acid, potassium bichromate/sulfuric acid and stearic acid;

2) a buffering agent that inhibits copper oxidation of the unremoved copper forming the lines by setting up a competing reaction with copper radicals, such as various benzotriazole compounds sold under the trade name "BTA" (e.g. 1-H benzotriazole, 1-OH benzotriazole, 1-CH3 benzotriazole, 5-CH3benzotriazole, benzimidazole, 2 OH, 2-methyl-benzimidazole, 5-Cl benzotriazole); and 3) a sulfatty acid surfactant, for example, a version of sodium jauryl sulfate, available commercially as one or more of the series of Duponols, such as Duponol SP, that competes with BTA for copper reaction sites to slow down Cu-BTA complexing, as will be described in more detail below.

Figure 2:
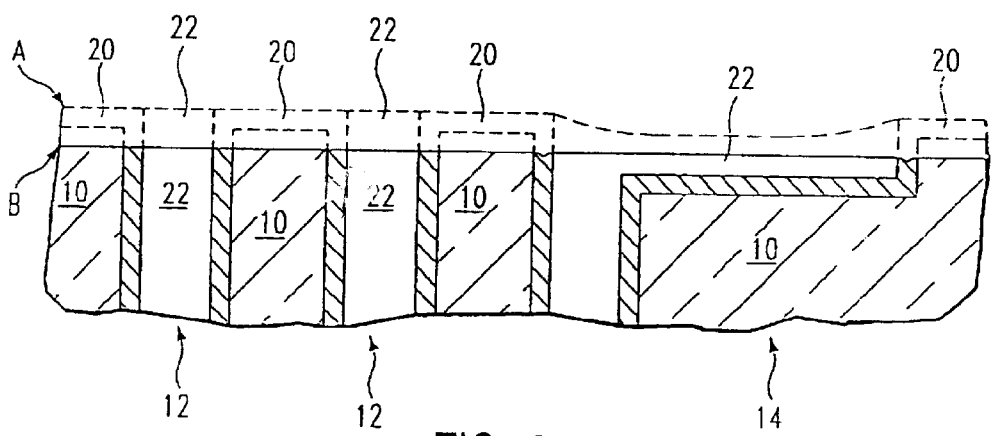
FIG. 2 is a cross sectional view of a substrate following the removal of the copper layer.
Figure 3:
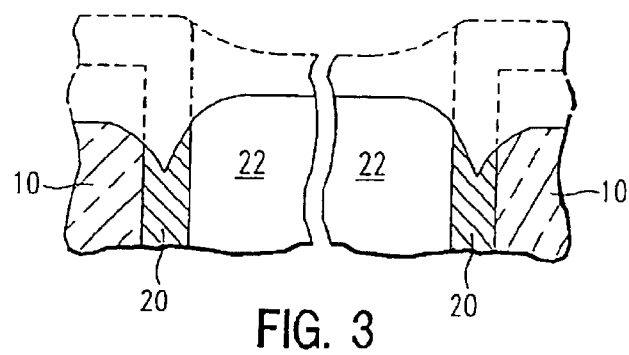
FIG. 3 is an enlarged sectional view of a portion of the surface of a semiconductor device following the removal of the liner layer.

Before describing the process in detail, the objectives of the invention will be described with reference to FIG. 3, which shows an enlarged view of the top surface of a semiconductor substrate before and after the removal of the liner from the surface. As in FIG. 2 the dashed lines show the surface before removal. In the practice of the invention, it is desired to remove all of the liner 20 overlying the insulator 10 leaving the top surface of the deposited copper protruding slightly above the top surface of the insulator by removing portions of the surrounding insulator oxide 10. That is, the final topography of the substrate is not planar but provides for the protrusion of the copper slightly above the background oxide layer. This is particularly true for fine lines, as described above.

In order to successfully remove the liner selectively to the copper and underlying oxide, we found that we had to first consider the removal of any residual copper which might remain on the line following the initial copper removal step. This residual copper might be trapped in scratches formed before the deposition of copper and which is not removed during the copper polish step. Thus, in addition to providing abrasive material for the Ta/TaN liner, one needs to provide an oxidizer for any residual copper. The slurry for the liner needs also to include an inhibitor to prevent the etching of exposed copper forming the desired lines and vias in the oxide-covered substrate. As shown in FIG. 3, it is desirable to provide a finished surface wherein the copper is slightly raised above the planarized surface of the substrate.

In order to accomplish all of the above, it is necessary to be able to control the rate of polishing of the liner 22 and the insulator 10 to be greater than the rate of polishing of copper. Accordingly, the following basic formula was found to provide the optimum for removing the Ta/TaN liner from a silicon dioxide passivated semiconductor substrate.

One liter of colloidal silica (Cabot SC-E) containing between 2 and 30 percent solids by weight per liter of deionized water;

between 0 and 10 ml/l 30% aqueous hydrogen peroxide as an oxidizer;

between 1.5 to .6.0 ml/l Duponol surfactant; and between 0,4 and 4.0 g/l BTA. Balanced to a pH of between 3.0 and 7.5.

The preferred embodiment includes colloidal silica at 15% by weight, 3.0 ml/liter hydrogen peroxide, 3.0 ml/liter of Duponol SP and 1.2 g/liter BTA, balanced to a pH of 4.5.

It should be understood by those skilled in the art that other abrasives such as ceria and alumina could be used. The inventors found that the addition of Duponol SP was essential to enhance the polishing characteristics. While the prior art utilizes surfactants primarily to promote uniformity in the CMP slurry suspension, in the present invention Duponol SP is used more for its properties as a wetting agent (i.e. it decreases the surface tension of the slurry). Typically, when using surfactants to stabilize the concentration of particulate in suspension, higher molecular weight surfactants are used (for example, the above cited Clarkson paper teaches use of a surfactant having a molecular weight on the order of 1M). As will be described in more detail below, in the present invention lower molecular weight surfactants are used; the inventors stabilize particulate concentration by controlling the pH of the slurry.

The inventors have found that controlling temperature during the polish process is important to maximize the tantalum removal rate while minimizing dishing of exposed copper. More specifically, the inventors have found that the temperature of the slurry increases as the polish proceeds, due to the frictional forces inherent in the polish process as well as the chemical components of the above-specified copper complexing reaction. The inventors have found that if the temperature rises above approximately 100 degrees F., dishing results because the polishing pad begins to deform (i.e. the glass transition temperature of the pad is reached), and as a result the chemical component of the CMP process increases. In practice, this temperature control is achieved by utilizing a water-cooled platen.

The inventors have found that the slurry of the invention can be premixed (i.e. some slurries can only be mixed at the CMP tool due to rapid degradation in stability), and the premixed slurry is stable for a week or more. Most CMP slurries at the pH range of the invention tend to lose stability quickly.

EXAMPLE 1

A workpiece prepared as above was polished in a colloidal silica dispersion having particulate on the order of 0.4 microns or less, available from Cabot Inc. as SC-E. This grain size appears to provide the optimum tradeoff between enhanced removal rates and low removal rate in the barrier film. The slurry included 18 liters deionized water (15% silica), 1.2 grams/liter BTA, 3 grams/liter 30% hydrogen peroxide, and 1.2 ml/liter Duponol SP, such that the total slurry had a pH of approximately 4.5. The CMP polish pad used was a non-woven pad, consisting of synthetic fibers in a polymer binder. The table speed was 75 RPM, and the spin speed of the wafer holder was 50 RPM. The wafer was held against the polish pad at a pressure of 6 PSI. The resulting removal rate was approximately 40nm/minute of tantalum, 25 nm per minute of silicon dioxide and 5 nm/minute copper.

In addition to polishing tantalum-based liner materials, the slurry of the present invention is believed to be applicable to other tantalum alloys and other refractory liners that would be polished in accordance with the reaction kinetics described above.

It should be understood that the above and other modifications in the practice of the invention can be made to the preferred embodiment as set forth above without departing from the spirit and scope of the present invention.

What is claimed is:

1. A method of co-planarizing copper or copper-based metallurgy and a refractory metal-based barrier layer or liner in an interlevel dielectric layer of a semiconductor device comprising the steps of:

planarizing said copper or copper-based metallurgy using a first slurry comprising an oxidizing agent comprising ferric nitrate, an oxidation inhibitor, a surfactant and an abrasive comprising alumina in water; said first slurry having a pH of between 1.2 and 2.5 and said first slurry for removing copper selectively with respect to said barrier layer or liner, and co-planarizing said barrier layer or liner and said interlevel dielectric layer using a second slurry consisting of a peroxide agent, a copper oxidation inhibitor, a surfactant, and an abrasive comprising silica in water; said second slurry having a pH of between 3.0 and 7.5 and said second slurry for removing said barrier layer or liner.

2. The method of claim 1, wherein said second slurry removes said barrier layer or liner at a first removal rate and copper at a second removal rate, the first removal rate greater than the second removal rate.

3. The method of claim 2, wherein the first removal rate is about eight times greater than the second removal rate.

4. The method of claim 1, wherein said peroxide agent comprises hydrogen peroxide.

5. The method of claim 1, wherein said copper oxidation inhibitor comprises BTA.

6. The method of claim 1, wherein said surfactant regulates complexing between copper and the copper oxidation inhibitor.

7. The method of claim 6, wherein said surfactant comprises sodium lauryl sulfate.

8. The method of claim 1, wherein said abrasive comprises colloidal silica.

* * * * *